United States Patent
Ruby et al.

[11] Patent Number: 6,091,021
[45] Date of Patent: *Jul. 18, 2000

[54] SILICON CELLS MADE BY SELF-ALIGNED SELECTIVE-EMITTER PLASMA-ETCHBACK PROCESS

[75] Inventors: Douglas S. Ruby; William K. Schubert; James M. Gee; Saleem H. Zaidi, all of Albuquerque, N. Mex.

[73] Assignee: Sandia Corporation, Albuquerque, N. Mex.

[*] Notice: This patent is subject to a terminal disclaimer.

[21] Appl. No.: 09/191,319

[22] Filed: Nov. 13, 1998

Related U.S. Application Data

[63] Continuation-in-part of application No. 08/742,378, Nov. 1, 1996, Pat. No. 5,871,591.

[51] Int. Cl.$^7$ .................................................. H01L 31/00
[52] U.S. Cl. .......................... 136/261; 136/255; 136/256
[58] Field of Search .................... 136/261, 255, 136/256

[56] References Cited

U.S. PATENT DOCUMENTS 5,871,591  2/1999  Ruby et al. .............................. 136/261

OTHER PUBLICATIONS

J. Horzel, et al., Proc. 28$^{th}$ PVSC, Sep. 1997, pp. 139–142.

K. Fukui, Y. Inomata, K. Shirasawa, "Surface Texturing Using Reactive Ion Etching for Multicrystalline Silicon Solar Cells."

D. S. Ruby, W. L. Wilbanks, C. B. Fleddermann, and J. I. Hanoka, "The Effect of Hydrogen–Plasma and PECVD–Nitride Deposition on Bulk and Surface Passivation in String–Ribbon Silicon Solar Cells," Proc. 13$^{th}$ EPSEC, Oct. 1995, pp. 1412–1414.

T. Lauinger, A. Aberle, and R. Hezel, "Comparison of Direct and Remote PECVD Silicon Nitride Films for Low–Temperature Surface Passivation," Proc. 14$^{th}$ EPSEC, Jun.–Jul., 1997.

D. S. Ruby, W. L. Wilbanks, C. B. Fleddermann, "A Statistical Analysis of the Effect of PECVD Deposition Parameters on Surface and Bul Recombination in Silicon Solar Cells," Proc. 1$^{st}$ WCPEC, Dec., 1994, pp. 1335–1338.

D. S. Ruby, et al., "Optimization of Plasma Deposition and Etching Processes for Commercial Multicrystalline Silicon Solar Cells," Proc. 25$^{th}$ PVSC, May 1996, pp. 637–640.

D. S. Ruby, P. Yang, M. Roy and S. Narayanan, "Recent Progress on the Self–Aligned, Selective–Emitter Silicon Solar Cells," Proc. 26$^{th}$ IEEE PVSC, Anaheim, CA, Sep. 1997, pp. 39–42 (Does not disclose texturing—other subject matter covered by parent application filing date).

(List continued on next page.)

*Primary Examiner*—Mark Chapman
*Attorney, Agent, or Firm*—Russell D. Elliott

[57] ABSTRACT

Photovoltaic cells and methods for making them are disclosed wherein the metallized grids of the cells are used to mask portions of cell emitter regions to allow selective etching of phosphorus-doped emitter regions. The preferred etchant is $SF_6$ or a combination of $SF_6$ and $O_2$. This self-aligned selective etching allows for enhanced blue response (versus cells with uniform heavy doping of the emitter) while preserving heavier doping in the region beneath the gridlines needed for low contact resistance. Embodiments are disclosed for making cells with or without textured surfaces. Optional steps include plasma hydrogenation and PECVD nitride deposition, each of which are suited to customized applications for requirements of given cells to be manufactured. The techniques disclosed could replace expensive and difficult alignment methodologies used to obtain selectively etched emitters, and they may be easily integrated with existing plasma processing methods and techniques of the invention may be accomplished in a single plasma-processing chamber.

29 Claims, 14 Drawing Sheets

OTHER PUBLICATIONS

Y. Inomata, K. Fukui, K. Shirasawa, "Surface Texturing of Large Area Multicrystalline Silicon Solar Cells Using Reactive Ion Etching Method," Technical Digest of the International PVSEC–9, Miyazaki, Japan, 1996, pp. 109–110.

S. H. Zaidi, S. R. J. Brueck, "Si Texturing with Sub–Wavelength Structures," Proc. $26^{th}$ PVSC, Sep. 1997.

P. Doshi, G. E. Jellison, Jr., and A. Rohatgi, "Characterization and optimization of absorbing plasma–enhanced chemical vapor deposition antireflection coatings for silicon photovoltaics," Appl. Opt., 36, Oct. 20, 1997.

SILICON CELLS MADE BY SELF-ALIGNED SELECTIVE-EMITTER PLASMA-ETCHBACK PROCESS

This application is a continuation-in-part of application Ser. No. 08/742,378, filed Nov. 1, 1996, now U.S. Pat. No. 5,871,591.

GOVERNMENT RIGHTS

The United States Government has rights in this invention pursuant to Contract No. DE-AC04-94AL85000 awarded by the U.S. Department of Energy. The Government has certain rights in this invention

BACKGROUND OF THE INVENTION

1. Field of Invention

This invention pertains generally to the field of multicrystalline silicon solar cells and improvements to their manufacture directed to improved electrical and optical performance. More specifically, the invention pertains to tailoring emitter silicon doping profiles and enhancing light absorption of solar cells using an engineered texturing treatment compatible with standard solar cell manufacturing processes.

2. Description of the Related Art

Multicrystalline silicon (mc-Si) is a frequently used semiconductor substrate in the manufacture of silicon solar cells. Single crystal silicon (sc-Si), while exhibiting favorable electrical characteristics related to the presence of fewer crystal imperfections as compared with mc-Si is much more energy and cost intensive to produce than mc-Si, and therefore, the commercial market in silicon solar cells depends significantly on mc-Si.

Various phenomena effect the cell's electrical efficiency and response to different wavelengths of light. Optimal solar cell performance depends on at least three factors: maximized absorption of light which causes generation of free electrical charges within the semiconductor matrix of the cell due to the photoelectric effect; minimized recombination, which is annihilation of charges within the cell before they enter electrical contacts affixed to the semiconductor matrix; and minimized contact resistance at the junction between the crystalline semiconductor portion of the cell and the metal contacts used to collect charges and route current outside of the cell.

Maximizing light absorption may involve application of anti-reflective coatings on solar cell surfaces exposed to light. Another technique is to create rough or textured surfaces on cells to increase the amount of incident light that ultimately enters the semiconductor matrix of the cell. Oftentimes, the combination of both of these approaches is useful.

As noted, recombination causes a decrease in the current-generating capacity of a cell. Examples of factors that can increase recombination include presence in the semiconductor matrix of recombination centers (traps) where holes and electrons recombine and negate the benefits associated with the photoelectric effect, and crystal impurities that result in the presence of regions or surfaces with dangling bonds capable of binding charge carriers. Techniques for minimizing recombination include gettering and passivating surface and bulk portions of the semiconductor material using atomic hydrogen. The effect of each of these techniques is to remove or neutralize crystal imperfections that interfere with the movement of free charge carriers.

Minimizing contact resistance can be less straightforward because of the optical and electrical characteristics of silicon semiconductor material. A low-cost method for positioning metal contacts on mc-Si solar cell surfaces is by screen-printing gridlines. The metal contacts are needed to collect and utilize the free electrons generated by the photoelectric effect. Often, the metal contacts contain silver applied in the form of particles suspended in an organic paste. During processing the organic component in the paste is burned off, leaving the silver affixed to the surface of the cell in a desired configuration. Given this context, the standard approach in industry for reducing contact resistance is to dope the cell emitter using phosphorus in the region where the metal contacts are to be positioned. Although this technique improves the electrical connection between the metal gridlines and the surface of the cell, the presence of P atoms within the crystal matrix can cause an increase in recombination losses, for example, where the P atoms are infused near the cell surface, known as the emitter. Recombination in this upper region of the cell, where light in the blue range of the spectrum is most likely to be absorbed, causes the cell to exhibit a poor blue response. Common techniques for minimizing this detrimental effect include either lightly doping the cell surface or partially etching the cell surface after doping to reduce the amount of P in the crystal. While this preserves some blue response in the cell, it is counterproductive as regards reducing the contact resistance where the P concentration is low in the region of the junction between the cell surface and the metal contacts.

Efforts have been made to selectively engineer the doping profile of solar cells so as to derive maximum benefit from P doping in the region of contact metallization while minimizing doping between contacts. This selectively patterned emitter doping profile (selective emitter) has historically been obtained by using expensive photolithographic or screen-printed alignment techniques and multiple high-temperature diffusion steps. J. Horzel, et al., Proc. $26^{th}$ PVSC, September 1997, pp.139–142. Another technique used to improve cell performance is plasma-enhanced chemical vapor deposition (PECVD). This is recognized as a potentially cost-effective way to provide simultaneous surface passivation and an effective anti-reflection coating. To gain the full benefit from improved emitter-surface passivation on cell performance, though, it is still desirable to tailor the emitter doping profile so that the emitter is lightly doped between the gridlines, but heavily doped beneath them. This is especially true for screen-printed gridlines, which require very heavy doping beneath the grid for acceptably low contact resistance.

The need exists, therefore, for cost and energy efficient technology that permits selectively doping the emitter profile of mc-Si solar cells which is compatible with commonly employed methods of solar cell manufacture. Additionally, there is a need for texturing methodologies that are likewise compatible with existing manufacturing techniques.

BRIEF SUMMARY OF THE INVENTION

In this disclosure, a self-aligned emitter etchback technique is described that requires only a single emitter diffusion (P doping step) and no physical alignments, outside of simply depositing gridlines according to established practice, to form self-aligned, patterned-emitter profiles. According to the present invention, standard commercial screen-printed gridlines serve as a mask to preserve P doping beneath the gridlines when plasma-etchback is performed on the cell emitter to decrease recombination losses in the emitter region and enhance the cell's blue response. A subsequent PECVD-nitride deposition provides good surface and bulk passivation and an antireflection coating. The plasma-etching process may also be modified to result in a low-reflectance, textured surface on multicrystalline silicon cells. Using this technique, reflectance can be significantly reduced without etching away the desirable features of an emitter diffusion. All of these enhancements are compatible with existing semiconductor material manufacturing and treatment methodologies and can be adapted for use in a single plasma processing chamber. The treatments disclosed here are robust and amenable to customized use and sequencing of plasma treatments depending on the characteristics ultimately sought for the mc-Si photovoltaic cells manufactured for a given purpose.

Accordingly, an advantage of the invention is that it provides a method for tailoring the doping profile of a silicon solar cell using self-aligned emitter etchback wherein the gridlines on a cell serve as a mask.

Another advantage of the invention is that it provides techniques for enhancing the performance of silicon solar cells including PECVD-nitride deposition, hydrogenation and texturing using plasma etching.

Yet another advantage of the present invention is that it provides methods for enhancing the performance of silicon solar cells using low-temperature bulk and surface passivation of semiconductor material.

Another advantage of the invention is that it provides a method for conveniently texturing the surface of mc-Si solar cells.

Another advantage is that the invention provides solar cells with emitter characteristics engineered to minimize contact resistance while maintaining satisfactory blue response.

Yet another advantage is that the invention provides mc-Si solar cells with textured surfaces.

Yet another advantage is that the invention provides mc-Si solar cell enhancements that are compatible with existing screen-printing or analogous metal contacting processes used in manufacturing solar cells and that those enhancements can be accomplished in a single plasma processing chamber.

Upon further study of the specification and appended claims, further objects and advantages of the invention will become apparent to those skilled in the art.

DETAILED DISCUSSION

Figure 1C:
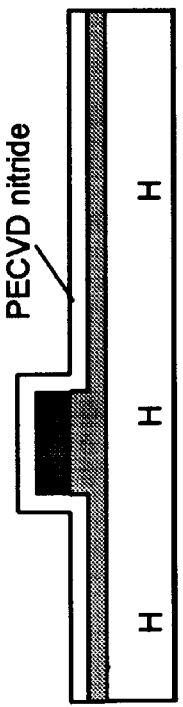
FIGS. 1(a)–1(d) illustrate schematically steps taken in manufacturing self-aligned, selective emitter solar cells using the etchback process of the present invention.

Improved performance of standard commercial screen-printed solar cells is achieved in the present invention through incorporating high-efficiency design features without incurring a disproportionate increase in either process complexity or cost. Instead of using a uniformly heavily doped homogeneous emitter and non-passivating antireflection coating (ARC), the method of the present invention uses engineered plasma processing techniques to achieve a high-performance selectively patterned diffusion that is automatically aligned vis a vis the metal contacts. Also disclosed are techniques for covering the diffusion with a passivating ARC and texturing the surface of the mc-Si.

According to the preferred embodiment of the invention, the solar cell material used is mc-Si which has initially been heavily doped with P in the emitter region and then had standard screen-printed gridlines deposited atop the emitter. Selective patterning is obtained through a technique of etching back only those portions of the diffused emitter where high doping has a deleterious effect, meaning specifically, those regions of the emitter that are not beneath the gridlines. To accomplish this, the grids of the solar cell are themselves used to mask the plasma etch so that only the emitter in the region between the grids is etched. The region beneath the grids remains heavily doped for low contact resistance. After the emitter etch is performed, a silicon nitride layer may be deposited by plasma-enhanced chemical vapor deposition (PECVD) and the solar cell can be annealed in forming gas. The PECVD nitride layer passivates the surface and provides an ARC. The nitride deposition can also provide improvement of bulk minority-carrier diffusion lengths through passivation of bulk defects. Additional passivation can also be achieved though an in-situ plasma hydrogenation. The plasma etch, nitride deposition, and plasma hydrogenation can be performed in the same chamber for reduced cost.

In another embodiment incorporating a variation of the plasma step, effective texturization of the mc-Si surfaces can be accomplished to significantly reduce front surface reflectance. Preferably, the starting material is the same as in the previously described embodiment. Existing texturing methods such as anisotropic wet chemical etchants and laser or mechanical texturing exhibit significant drawbacks in the context of mc-Si solar cell manufacture. Anisotropic etches, typically used for single-crystal Si, are not suited for use with mc-Si because of the random distribution of crystalline grain orientations. Anisotropic etches rely on continuity in innate crystal orientations whereas the plasma techniques described in this patent application function independent of crystal orientation. Laser and mechanical texturing is likewise often undesirable because those methods can be too slow and expensive to offer commercially advantageous treatment methodologies. In contrast to laser or mechanical texturing, plasma-etching according to the present invention textures the entire cell at once. This, in part, allows for the high manufacturing throughput potential associated with the present invention.

The invention employs a $SF_6$ etching process to achieve, in a single processing chamber, both self-aligned emitter etchback and, when chosen, good surface texturing. Texturing according to the invention is done after the metallization step and as part of the emitter-etchback process. This is distinguished from a method developed by Inomata, et al. (see: Y. Inomata, K. Fukui, K. Shirasawa, Solar Energy Mat. Solar Cells, 48 (1997), pp. 237–242), where $Cl_2$-based reactive ion etching (RIE) is performed on mc-Si prior to metallization, and therefore, production efficiencies associated with the selective-emitter process and solar cells of the present invention are not realized. RIE using $SF_6$ according to the invention methods disclosed in the description and examples below both removes the heavily diffused region and any gettered impurities between the gridlines and can achieve desired texturing of a solar cell surface.

For purposes of this specification, terms such as top, bottom, above, below, atop and beneath, and other terms like them, are used solely for convenience in describing the features of the invention and are not intended to be limitative of the scope of the claims. It is recognized that the invention principles may be suited to various orientations of solar cell material processed or undergoing processing, so long as the deposition, diffusion, etching and other steps described here can be satisfactorily accomplished.

SASE Plasma Etchback

For this embodiment, a self-aligned selective-emitter (SASE) plasma etchback process is described which can be used to yield tailored diffusion emitter characteristics. Cells manufactured in this way exhibit both low series resistance and favorable optical performance, including good blue response.

Figure 1D:
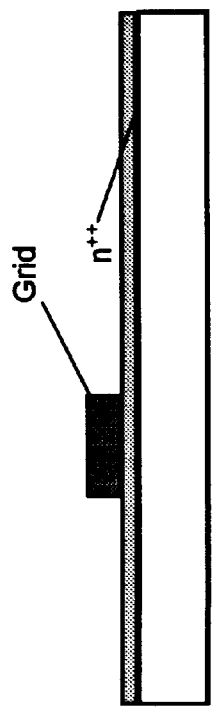
Figure 1A:
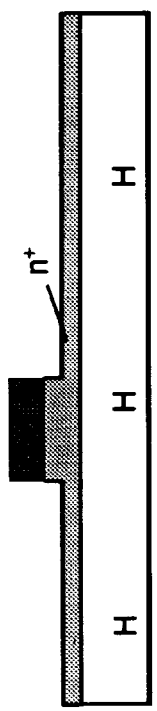

Referring to FIG. 1(a), phosphorus is heavily diffused into the top surface of a mc-Si substrate to form a highly doped emitter region, denoted in the Figure as $n^{++}$. This heavy doping results in the migration of deleterious impurities to the emitter surface (gettering) which improves the carrier diffusion lengths in the bulk portion of the mc-Si substrate.

Figure 1B:
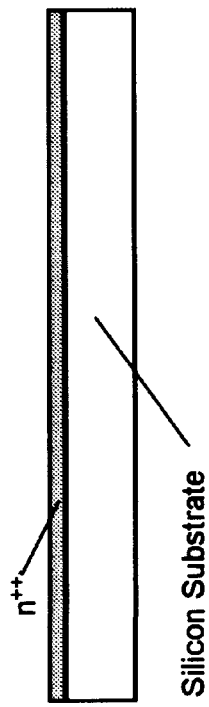

Next, as shown in FIG. 1(b), metal gridlines are applied by the standard techniques such as screen-printing with silver paste. Following this step, the wafer may be plasma hydrogenated (using a $NH_3$ plasma or $H_2$ plasma, for example) to inject atomic hydrogen (H) into the bulk of the substrate. This can result in further improved bulk diffusion lengths. Plasma hydrogenation in this fashion beneficially reduces the contact resistance at the junction of the gridlines and the emitter. As will be summarized later, however, this plasma hydrogenation step is optional and represents one aspect of how the invention can be customized to suit the needs associated with various applications without departing from the scope of the claims.

Referring now to FIG. 1(c), the emitter is then etched back using a plasma etch which, in the preferred approach, is RIE using $SF_6$. This selectively removes P-doped silicon from between the gridlines leaving the gridlines and the silicon underlying them unaffected. This etching removes the most heavily doped portion of the emitter, along with any impurities gettered to the emitter surface as well as damage that may have been done to the surface as a consequence of the optional plasma hydrogenation. Since the gridlines serve as the mask for the etching process, the technique provides automatic alignment of the heavily doped region with the metal gridlines. Heavily doped regions remain only under the gridlines where lower contact resistance and lower contact recombination properties are desired. Regions that are more lightly doped as a consequence of the etching having been performed, shown as $n^+$ in FIG. 1(c), are found between the gridlines. They exhibit reduced emitter recombination and are amenable to surface passivation. Because the process is self-aligning, it is simple and low in cost as compared with current industry methods of tailoring diffusion profiles utilizing expensive photolithographic or advanced screen-printed alignment techniques or multiple high-temperature diffusion steps.

Then, as shown in FIG. 1(d), according to the process of the present invention, a PECVD-nitride film may be applied to the emitter surface. This provides effective surface passivation to the less-heavily-doped areas of the emitter between the gridlines, thereby improving current collection by the solar cell. This nitride layer also serves as an ARC, replacing the ARC applied to cells manufactured using the ordinary fabrication sequence typically employed in industry. If the deposited nitride is applied in the same plasma reactor as was used for the optional plasma hydrogenation and plasma etching, significant simplification and cost savings can be realized over standard processing techniques used to obtain a tailored emitter doping profile. Additionally, hydrogenation may be performed during the nitride-deposition sequence, as well. According to this optional technique, a thin layer of nitride is deposited to protect the Si surface. Next, plasma hydrogenation is performed (for example, using $NH_3$) for surface and bulk passivation. And finally, more nitride is deposited to serve as an ARC.

SASE Plasma Etchback with Texturing

For this embodiment, the self-aligned selective-emitter (SASE) plasma etchback process just described is modified in regards to the plasma etch. According to this aspect of the invention, in addition to removing highly-doped Si and gettered impurities between gridlines, and passivating the cell surface (and perhaps bulk regions if the hydrogenation step is used), the surface of the emitter is textured, as well.

Figure 2A:
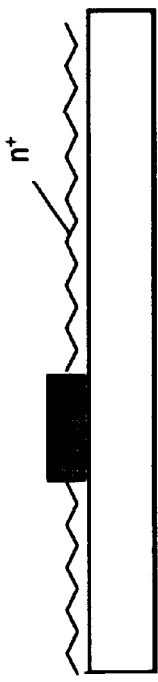
FIGS. 2(a)–2(d) illustrate schematically steps taken in manufacturing self-aligned, selective emitter solar cells using the etchback process of the present invention using the optional texturing embodiment.
Figure 2B:
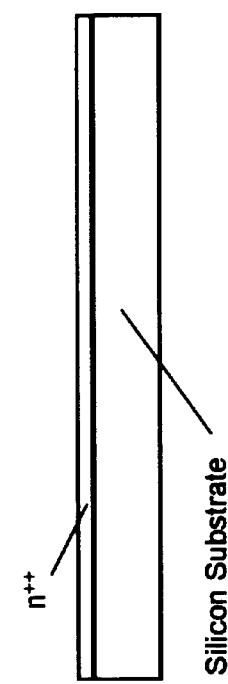

Referring to FIG. 2(a), as with the aspect of the invention process described earlier, a mc-Si substrate is heavily diffused with P (yielding a highly doped n-type region, shown as $n^{++}$ in the Figure). This region will serve as the emitter. Then, as shown in FIG. 2(b), the gridlines are deposited according to standard practices.

Figure 2C:
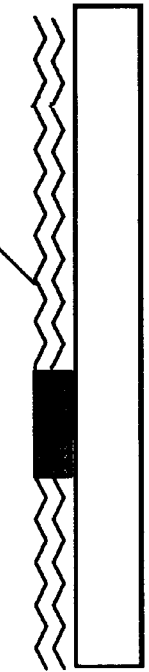
Figure 2D:
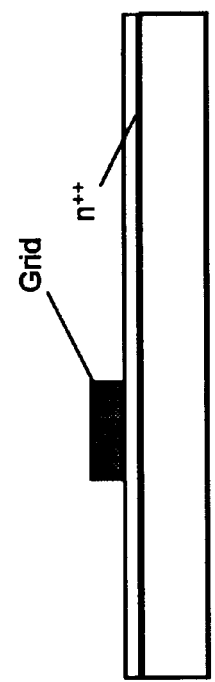

In FIG. 2(c), though, the plasma etch is modified over that described for the previous embodiment. In this case, it not only etches away a portion of the heavily doped emitter between the gridlines (leaving a less-heavily-doped region depicted n+ in the Figure), it also leaves an etched surface having a rough and irregular texture. This is accomplished using $SF_6$ gas mixed with $O_2$.

The texturing result is believed to be due to a micro-masking effect. To obtain texturing of the emitter surface, before the etchback step, a very thin pervious layer of material is deposited atop the doped emitter region of the Si substrate. Any pervious layer that performs the function of a micro-mask without having a deleterious effect on the remainder of the invention processes or products may be used. The preferred pervious layer for purposes of the invention is a thin polycrystalline coating such as $SiO_2$. (Metal deposited from vapor and forming grains on the Si surface could, for example, also create such a polycrystalline coating. Likewise, a metal colloidal film may be spin-coated to form the RIE micro-mask.) The polycrystalline coating is characterized by microcrystals (or crystallites) that are randomly positioned in a thin layer on top of the Si. Minute gaps exist at various locations between the crystallites.

During the etchback step that follows the deposition of the polycrystalline coating, etchant ($SF_6/O_2$, in the preferred embodiment) is able to pass through the gaps and selectively begin etching exposed Si in the gap locations before reaching Si underneath the microcrystals. As a result, minute, randomly distributed micro-craters are created in the surface of the emitter. Hence, the surface of the mc-Si is textured.

Figure 3:
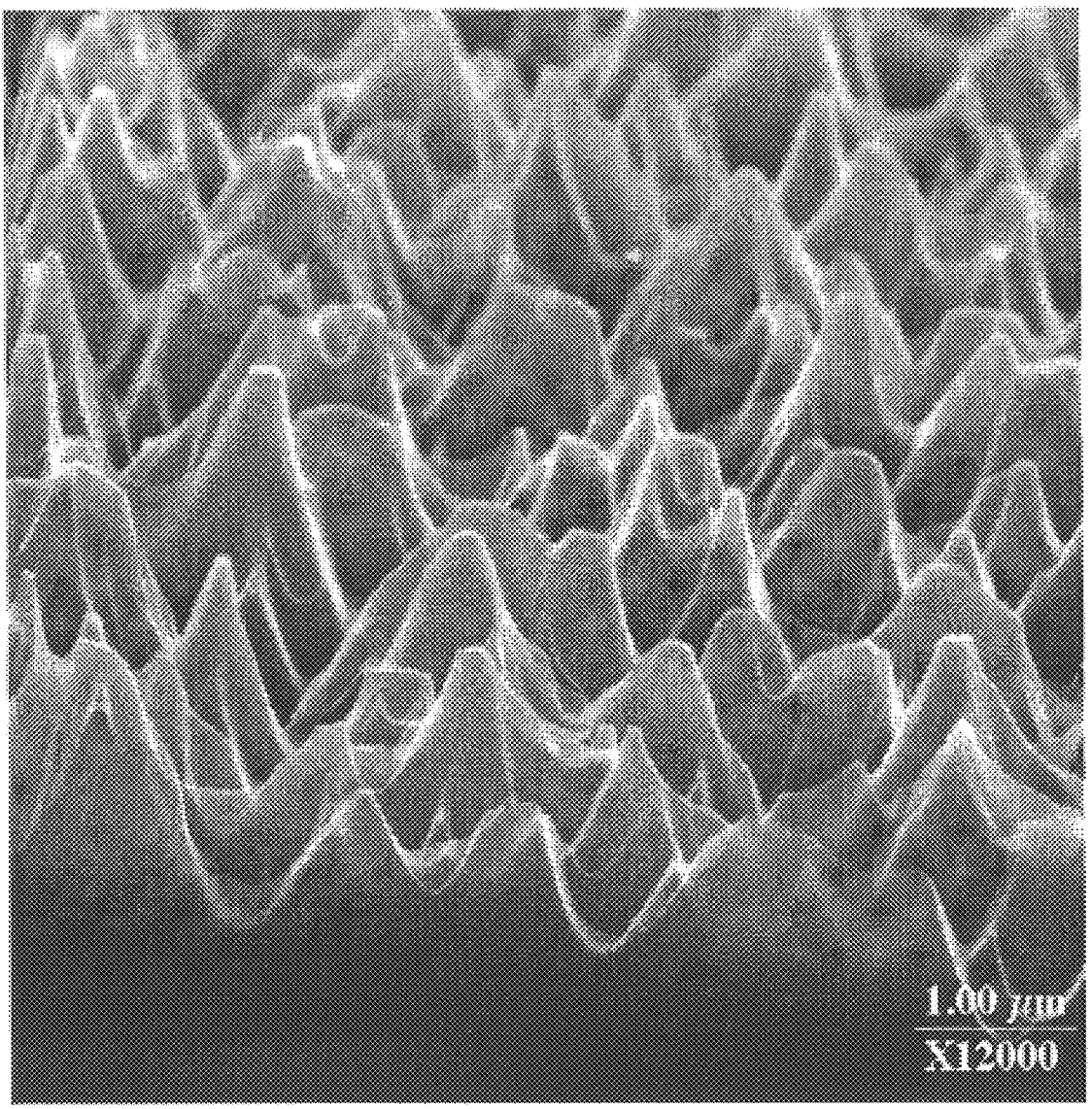
FIGS. 3–5 and 12–13 show example scanning electron micrograph images of various example cells textured using the principles of the invention.
Figure 4:
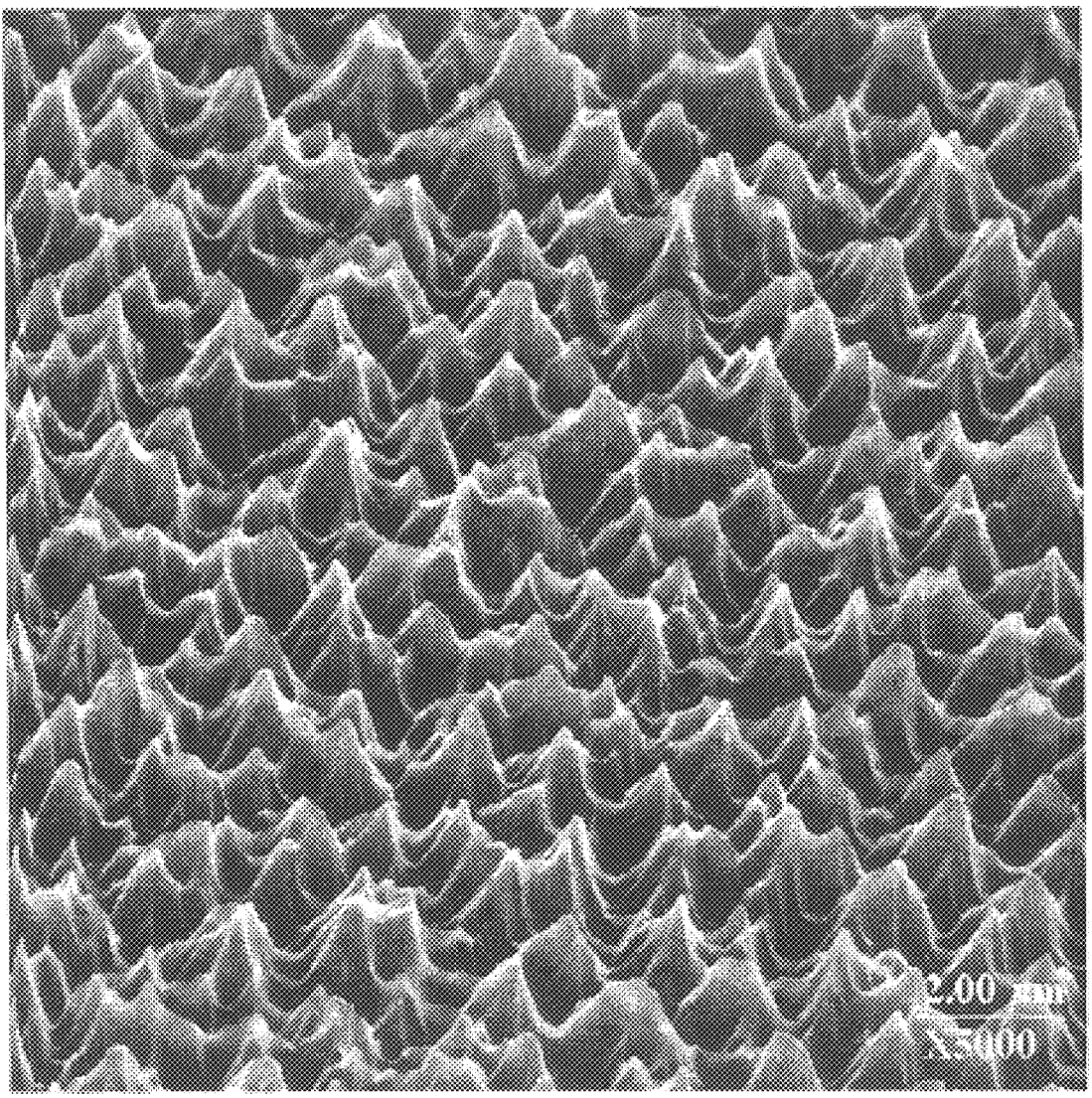
Figure 5:
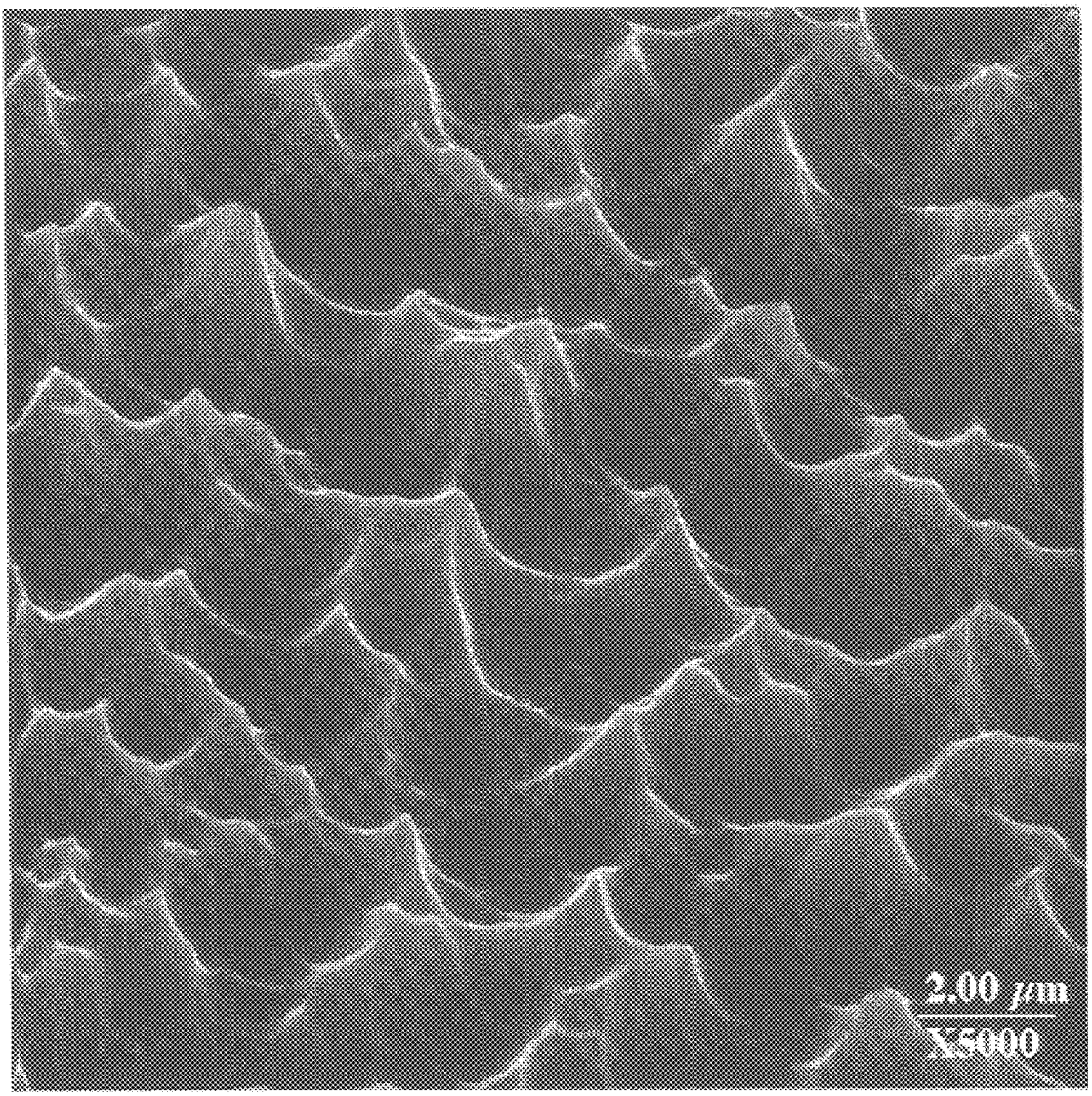

Of course, the $SiO_2$ layer is also susceptible to the etchant, but not as susceptible as the bare Si. For this reason, various results can be obtained by altering the thickness of the $SiO_2$ layer as well as the length of time the $SF_6/O_2$ etch is performed. It is possible to have too much $SiO_2$ (leaving insufficient gaps for the desired selective etching to occur at all). Likewise, in the other extreme, it is possible have insufficient $SiO_2$ (or to etch away too much $SiO_2$) leaving the Si surface open to uniform etching by the $SF_6/O_2$. In the examples that follow, data for different $SiO_2$ thicknesses is presented. It is believed, however, that without departing from the scope and spirit of the claimed invention it will be within the capability of those skilled in the art to experiment and identify appropriate thicknesses of polycrystalline coatings for various applications and desired results. FIGS. 3, 4 and 5 show illustrations of randomly textured surfaces that have been achieved using the invention. All are scanning electron microscope (SEM) micrographs and in each instance, the result was obtained by reactive ion etching following deposition of an oxide film mask. The scale for each micrograph is shown in its lower right-hand corner.

Referring finally to FIG. 2(*d*) a PECVD nitride layer is deposited for the purpose of protecting the Si surface and, if desired, to provide an ARC. As with the previously described embodiment shown in FIGS. 1(*a*)–1(*d*), the deposition of the nitride can be divided into two separate stages with an optional hydrogenation step interposed to provide surface and bulk passivation.

Figure 6:
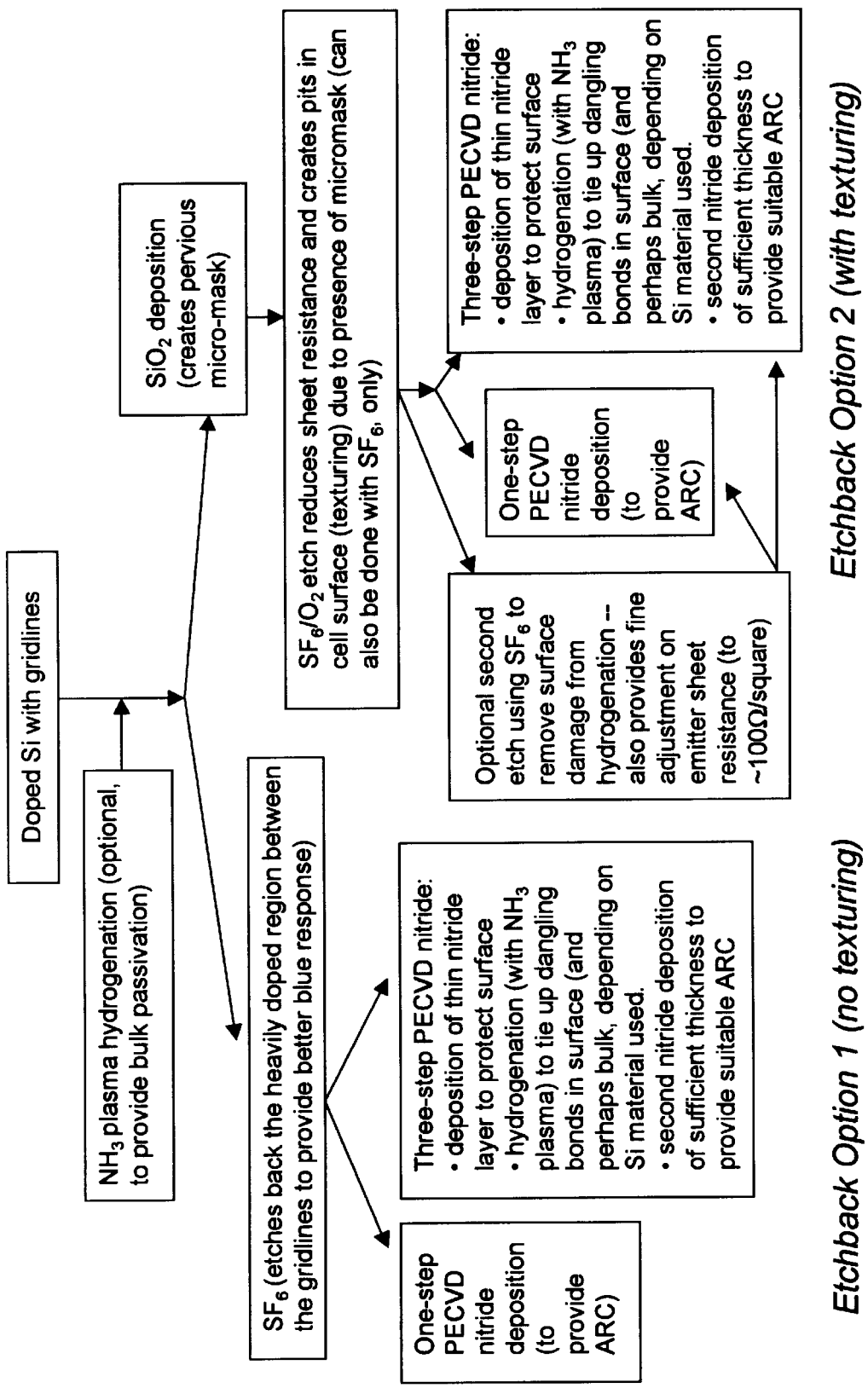
FIG. 6 is a flow chart showing various options, preferred embodiments and choices available regarding plasma treatments of solar cells using the invention.

FIG. 6 provides a summary of the processes and options available to those practicing the invention. The Figure shows a flow chart indicating various steps that may be taken and paths that may be followed to utilize the invention, starting from phosphorus-doped silicon with gridlines positioned on the emitter surface and finishing with a completed solar cell with a nitride ARC. It is also recognized that for certain applications it may be desirable to terminate treatment of a solar cell prior to reaching the final PECVD nitride deposition step. In the Figure, various choices available to practitioners of the invention are depicted by multiple arrows pointing in different directions from a common point of origin. Additionally, some steps have been specifically designated as optional.

Finally, although it is not shown in FIG. 6 because it uses a different starting material, another alternative is to start with an undoped mc-Si wafer without gridlines. According to this embodiment, texturing is performed, prior to doping the Si, using the RIE micro-mask techniques described in this disclosure. After the surface is textured, doping may then be performed followed by contact/grid formation. Solar cell material prepared in this fashion is suited to the self-aligned selective-emitter processes described elsewhere in this disclosure, and it is expected that those skilled in the art will be able to adapt the steps illustrated in FIG. 6 to mc-Si which has been pre-textured in this way.

It will be apparent to those skilled in the art that the processes of the present invention may be conveniently customized by including or omitting various deposition and etching operations as needed to accomplish given objectives. Once doped Si with gridlines attached is provided, it is possible to perform the various treatments described in this disclosure in a single reaction chamber plumbed to provide any or all of the gases utilized in the processes of the invention. In the preferred embodiment, those gases include $NH_3$, silane ($SiH_4$), $SF_6$, and oxygen. $NH_3$ used alone provides hydrogenation; $NH_3$ and silane used together provide the nitride deposition species; silane used with oxygen provides $SiO_2$ for the micro-mask; and $SF_6$ either alone or with oxygen serves as etchant. The silane can be diluted, according to techniques known to those skilled in the art, using a diluent that does not participate in the desired reactions in the chamber. Furthermore, the entire sequence and timing of the steps may easily be adapted to computer control. This may provide an even greater cost advantage in lowering dollars/watt of electricity generated using photovoltaic technology.

Without further elaboration, it is believed that those skilled in the art can, using the preceding description, utilize the present invention to its fullest extent. The following examples are therefore intended to be construed as merely illustrative and not limitative of the remainder of the disclosure in any way whatsoever.

EXAMPLES

Application of the embodiments just described is illustrated by the following experimental demonstrations that also reveal some of the performance advantages of the invention.

Example 1

In this example, cells are manufactured using the self-aligned, selective-emitter (SASE) process. Cells using SOLAREX™ cast multicrystalline silicon received standard production line processing through the printing and firing of the gridlines. Then, the cells were etched using reactive ion etching (RIE) to increase the sheet resistance of the emitters to 100 ohms/square. They were plasma-etched in a VACUTEC™ direct-plasma reactor that uses a standard dual, parallel-plate design and operates at 13.56 MHz. The etching was done using pure $SF_6$ at a power of 15 W and a pressure of 100 mTorr for about one minute. In a second VACUTEC™ chamber, the cells received a silicon-nitride deposition and optional ammonia-plasma hydrogenation (H-passivation) treatment, both found to be effective for bulk and surface passivation in STRING-RIBBON™ mc-Si. (See: D. S. Ruby, W. L. Wilbanks, C. B. Fleddermann and J. I. Hanoka, "The Effect of Hydrogen-Plasma and PECVD-Nitride Deposition on Bulk and Surface Passivation in String-Ribbon Silicon Solar Cells," *Proc.* 13*th EPSEC*, October 1995, pp. 1412–1414.) This type of high-frequency, direct PECVD-nitride film resulted in excellent emitter passivation and UV-stability, as good as that obtained by remote PECVD films that have produced record low recombination velocities. (See: T. Lauinger, A. Aberle, and R. Hezel, "Comparison of Direct and Remote PECVD Silicon Nitride Films for Low-Temperature Surface Passivation," *Proc.* 14$^{th}$ *EPSEC*, June–July, 1997.) The plasma-nitride depositions were performed at 330 C. using pure ammonia and either a 2% mixture of silane in argon or a 5% mixture of silane in helium. The hydrogenation treatments used similar conditions with the silane flow set to zero. The cells then received a forming gas anneal (FGA) at 300° C. and were returned to the SOLAREX™ production-line for back metallization.

Rather than simply deposit the plasma-nitride layer in one step, it was investigated whether additional performance gains could be obtained by incorporating an ammonia-plasma hydrogenation step into the deposition process. Gains in blue and red response using this approach have been previously reported, although damage to an unprotected emitter surface was also observed. (Id.)

Therefore, a 3-step deposition technique was investigated that consisted of deposition of a thin nitride protective layer, followed by the hydrogenation treatment, and then deposition of the remaining thickness of silicon-nitride required for antireflection purposes. The investigation of deposition parameters was conducted using a response surface methodology approach described in D. S. Ruby, W. L. Wilbanks, and C. B. Fleddermann, "A Statistical Analysis of the Effect of PECVD Deposition Parameters on Surface and Bulk Recombination in Silicon Solar Cells," Proc. $1^{st}$ WCPEC, December 1994, pp. 1335–1338, which is incorporated herein by reference in its entirety.

A main-effects analysis was performed, followed by a quadratic interaction experiment, which varied only the specific factors to find conditions for peak efficiency. Finally, a SASE process using the predicted optimum parameters was performed to confirm the prediction.

Results

Figure 7:
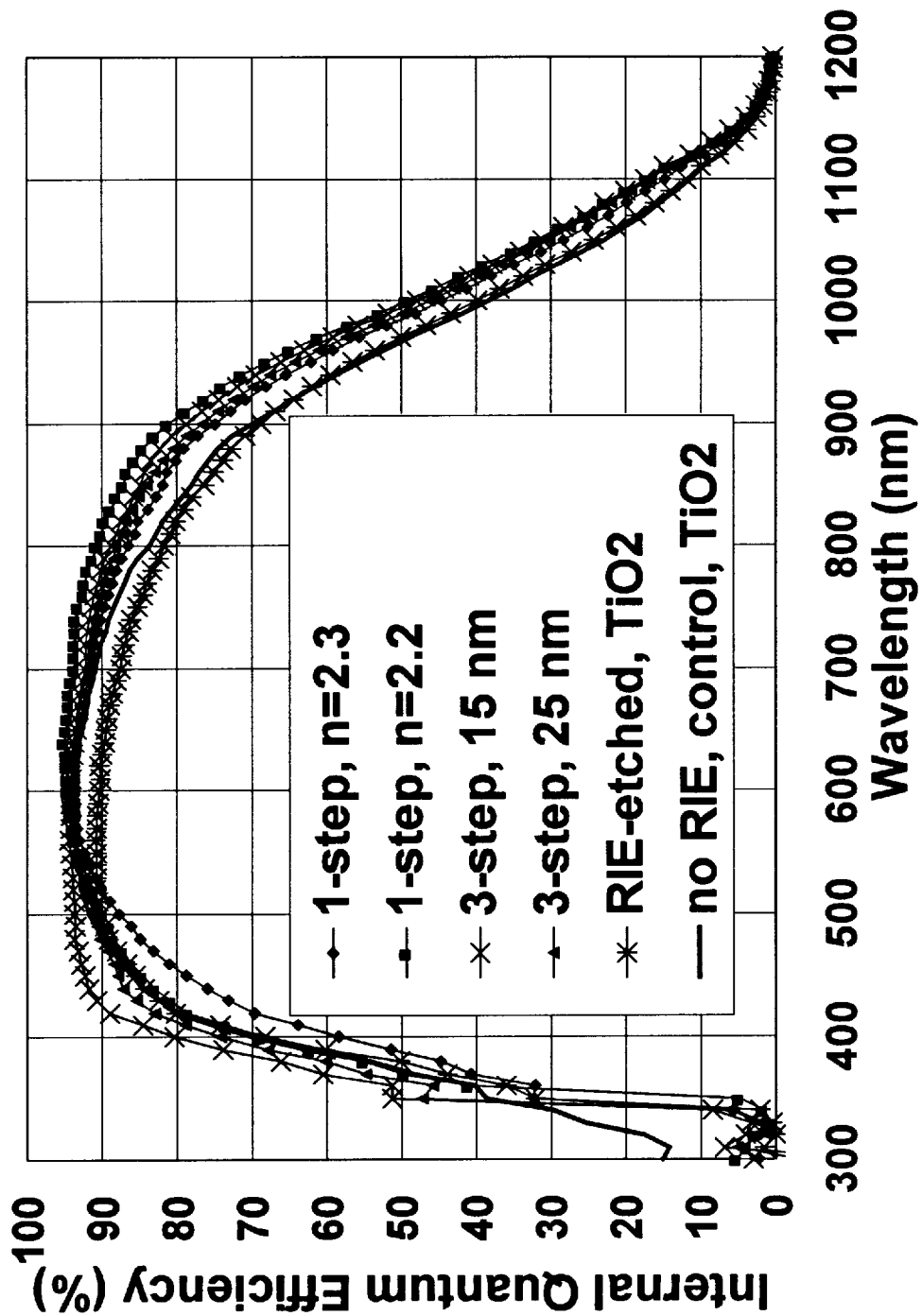
FIG. 7 presents IQE (internal quantum efficiency) curves for cells made according to an example embodiment using the invention principles.

The first experiment was a main-effects analysis that compared 1-step and 3-step depositions using six groups of full-size 130-cm² SOLAREX™ cells processed as described in Table 1. FIG. 7 contains internal quantum efficiency (IQE) curves of SOLAREX™ cells from Groups 1–6 described in Table 1, corrected for absorption in nitride films. Relative to the control cells in Group 6, the cells from Group 1 actually suffered an efficiency loss from the deposition of a 1-step nitride ARC. The SiN deposition process had drifted slightly and the nitride refractive index was slightly higher than the target value of 2.2, chosen to minimize absorption plus reflectance after encapsulation under glass. (See: P. Doshi, G. E. Jellison, Jr., and A. Rohatgi, "Characterization and optimization of absorbing plasma-enhanced chemical vapor deposited antireflection coatings for silicon photovoltaics," Appl. Opt., 36, Oct. 20, 1997.) As the corresponding internal quantum efficiency (IQE) curve in FIG. 7 shows, this resulted in lower blue response.

TABLE 1

| Eff. (%) | $J_{SC}$ (mA/cm²) | $V_{OC}$ (mV) | FF (%) |
|---|---|---|---|
| Group 1. RIE, 1-step SiN n = 2.3, FGA | | | |
| 12.6 ± 0.0 | 28.8 ± 0.1 | 585 ± 1 | 75.0 ± 0.4 |
| Group 2. RIE, 1-step SiN n = 2.2, FGA | | | |
| 12.8 ± 0.1 | 29.0 ± 0.1 | 585 ± 1 | 75.3 ± 0.1 |
| Group 3. RIE, 3-step SiN n = 2.2, 15-nm prot. film, FGA | | | |
| 13.0 ± 0.0 | 29.5 ± 0.0 | 589 ± 2 | 75.2 ± 0.1 |
| Group 4. RIE, 3-step SiN n = 2.2, 25-nm prot. film, FGA | | | |
| 13.1 ± 0.0 | 29.5 ± 0.1 | 589 ± 1 | 75.3 ± 0.3 |
| Group 5. RIE, TiO₂ ARC | | | |
| 12.9 ± 0.1 | 29.2 ± 0.0 | 586 ± 1 | 75.4 ± 0.3 |
| Group 6. Control Cells: No emitter etchback, TiO₂ ARC | | | |
| 12.9 ± 0.1 | 29.4 ± 0.0 | 586 ± 1 | 74.8 ± 0.2 |

(For purposes of the data in Table 1, transmittance=1-(reflectance+absorbtance).

The Group 2 cells performed almost identically to the controls with a slightly lower $J_{SC}$ compensated for by a slightly higher fill factor. The extremely low IQE of all the RIE-etched cells below 350 nm, possibly due to slight surface damage from etching, may account for the lower current, while a reduction in series resistance due to plasma processing noted earlier, may account for the higher fill factor (FF). (See: D. S. Ruby et al., "Optimization of Plasma Deposition and Etching Processes for Commercial Multicrystalline Silicon Solar Cells", Proc. 25th PVSC, May 1996, pp. 637–640.)

Groups 3 and 4, which used the 3-step deposition technique incorporating a hydrogenation step, showed the greatest gains in performance. These cells showed efficiency gains of up to 0.2% absolute over the controls, and 0.5% over the 1-step cells from Group 1. The greatest increase in blue response was seen in the cells with the thinner protective layer, which showed an IQE (400 nm) of 80%. This confirmed the negligible effect of RIE surface damage on cell performance.

The long-wavelength response of all the nitride-coated cells were consistently higher than that of the TiO₂-coated cells in Groups 5 and 6, presumably due to reduced bulk recombination from the plasma-nitride and hydrogenation treatments. Inverse-IQE analysis indicated that electron diffusion lengths in the bulk of cells from Groups 1–4 were typically around 130 μm, while those in cells from Groups 5 and 6 were 90 to 100 μm. This explained the somewhat higher $V_{OC}$ values for the 3-step cells.

(Quadratic Experiment)

Because the previous results showed that the in situ ammonia-plasma treatment in the 3-step nitride deposition process produced cells with the highest efficiency, an investigation was performed to determine which parameters of the 3-step process would optimize cell performance. Using response surface methodology, a quadratic experimental design in a statistical multiparameter experiment was used to find the optimum parameter set. The effects of 3 factors were studied: the thickness of the silicon-nitride protective layer, and the duration and power of the plasma treatment. The factors investigated and their ranges are shown in Table 2.

TABLE 2

| Parameter [units] | Minimum Value | Maximum Value |
|---|---|---|
| Thickness of nitride protective layer [nm] | 15 | 35 |
| Duration of ammonia-plasma treatment [min] | 10 | 20 |
| RF-power during ammonia plasma treatment [W] | 20 | 50 |

Figure 8:
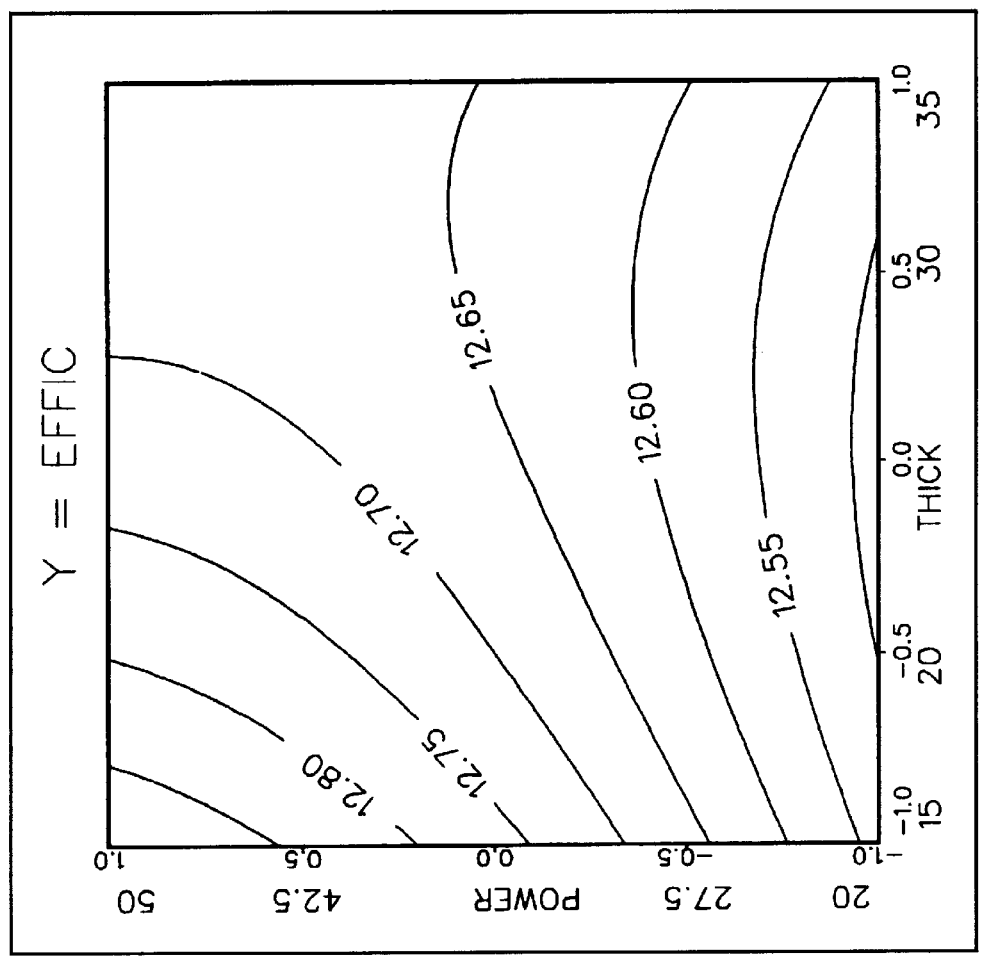
FIG. 8 shows an example response surface plot for cells made using the invention principles.

The results of the quadratic experiment are contour plots of the measured variables, which in this case were illuminated cell performance parameters. FIG. 8 shows a response surface plot of cell efficiency showing contours of constant efficiency (%) as a function of NH₃ plasma treatment power (W) and silicon-nitride protective film thickness (nm). The plasma treatment duration is fixed at its maximum value. Data in the Figure predicts an efficiency of 12.9% in a corner of the parameter space with the thinnest protective layer and maximum power and duration. This behavior suggests that even better results may be obtainable by extending the ranges of these parameters.

The 95% confidence limits associated with this contour plot show a statistical uncertainty of 0.2 percentage points in the upper-left corner due to material and process variability, implying that cells fabricated using these parameters could have an efficiency anywhere between 12.7 and 13.1%.

Indeed, when 2 cells were processed using this recipe, the average efficiency was 12.7%, with the best cell reaching 12.8%. Table 3 shows the normalized IV data for these 3-step cells processed using the predicted optimized parameters as well as data for control cells, 1-step cells and cells with two kinds of double-layer ARC (DLARC) processes.

TABLE 3

| Eff. (%) | $J_{SC}$ (mA/cm$^2$) | $V_{OC}$ (mV) | FF (%) |
|---|---|---|---|
| Control Cells: No RIE, TiO$_2$ ARC | | | |
| 12.3 ± 0.1 | 28.6 ± 0.0 | 584 ± 0 | 73.8 ± 0.4 |
| RIE, optimized 3-step, 15-nm prot. film, 50W, 20 min FGA | | | |
| 12.8 ± 0.1 | 29.2 ± 0.1 | 588 ± 0 | 74.5 ± 0.2 |
| RIE, 1-step n = 2.2, FGA | | | |
| 12.4 | 28.4 | 585 | 74.3 |
| RIE, 2-step DLARC, n = 2.4/2.0, FGA | | | |
| 12.4 ± 0.2 | 28.9 ± 0.1 | 586 ± 2 | 73.6 ± 0.8 |
| RIE, 3-step DLARC, n = 2.4/2.0, 50W, 20 min FGA | | | |
| 12.4 | 28.6 | 587 | 73.9 |

The Table 3 data are for illuminated IV parameters normalized to a constant transmittance of 88%, the average for the TiO$_2$ coated cells. These cells were from a different ingot of mc-Si than those of Table 1, with slightly lower performance in all groups.

As seen before, the 1-step SASE cell showed no discernible difference in performance from that of the control cells. However, as predicted by the statistical model, the optimized 3-step cells had an average efficiency of 12.8%, which is half an absolute percentage point greater than that of the control cells. As before, the 3-step SASE cells showed a slight improvement in $J_{SC}$ as well as $V_{OC}$ compared to the controls.

Figure 9:
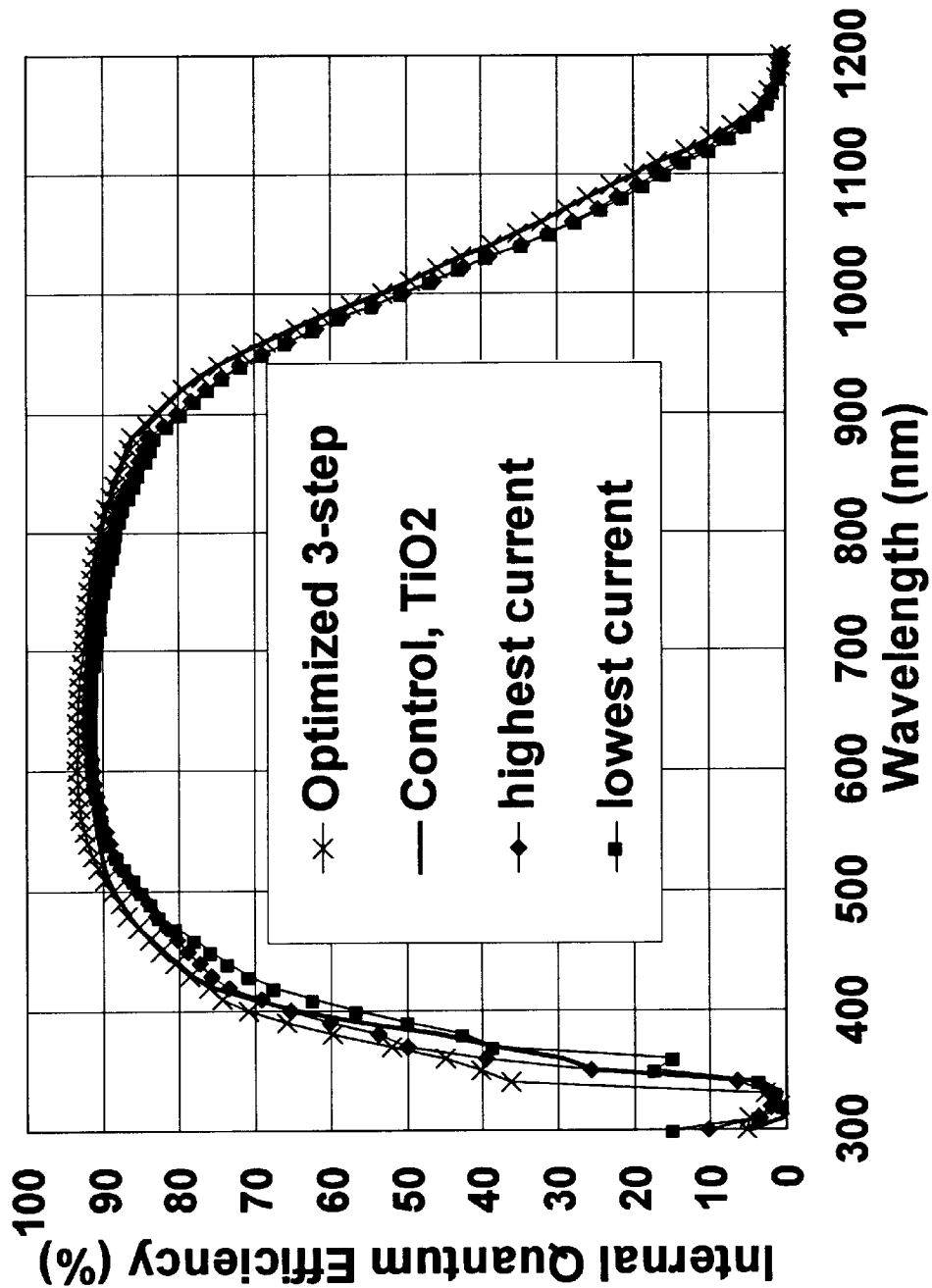
FIG. 9 shows IQE curves for cells made according to another example embodiment using the invention principles.

FIG. 9 depicts IQE curves of highest and lowest current cells from the Quadratic Experiment and the optimized 3-step and control cells in Table 3, corrected for absorption in nitride films using methods described in P. Doshi, G. E. Jellison, Jr., and A. Rohatgi (Id.) which is incorporated by reference herein in its entirety. FIG. 9 shows that the blue response of the optimized SASE cell slightly exceeded that of the control cell. Also shown in the Figure are the IQE curves of the two cells from the quadratic experiment with the highest and lowest measured currents. It is clear that the predicted optimum combination of NH$_3$-plasma conditions did result in the highest IQE overall. These nitride-passivated cells used a different SiH$_4$ gas mixture than those in FIG. 7 resulting in slightly lower blue response.

Also shown in Table 3 are performance data from three cells with DLARC SiN layers using refractive indices and thicknesses optimized for encapsulation under glass. These cells, with efficiencies and currents normalized to the same transmittance as the controls, appeared to have similar performance. However, with the lower reflectance expected of these DLARC cells after encapsulation, their performance was also expected to exceed those of the controls. The 3-step DLARC cell with the NH$_3$-treatment performed between the two nitride layer depositions performed the same as the 2-step DLARC cells without the NH$_3$-treatment. This shows that the initial 40-nm, 2.4 index film was too thick for the hydrogenation to be effective. However, the initial high-index layer itself could be put down in a 3-step process to gain the same benefits as the 3-step single-layer ARC (SLARC).

Conclusions Drawn from this Example

This investigation showed that the use of the SASE process in production-line fabrication of screen-printed solar cells resulted in improvement of half an absolute efficiency point over standard ARC controls. This was done using a single, industrial emitter-diffusion process and no alignments. This process resulted in a well-passivated emitter surface, and a less heavily doped emitter between gridlines for reduced emitter recombination. It allowed for heavier doping beneath the gridlines for lower contact resistance, reduced contact recombination, and better bulk defect gettering.

Example 2

This example process used cells that had received standard production-line processing through the printing and firing of the gridlines. Then the cells underwent RIE to first texture and etch away the most heavily-doped part of the emitters in the regions between the gridlines, increasing the sheet resistance in these areas to 100 ohms/square.

For emitter etchback, a new PLASMATHERM™ 790 reactor was used. This is a commercial RF dual parallel-plate reactor operating at 13.56 MHz. Wafers were etched in pure SF$_6$ at powers between 15 and 45 W and pressures ranging from 100 to 150 mTorr. Gas flow rates were between 14 and 26 sccm.

For texturization, room-temperature RIE was performed in a TECHNICS™, PEII-A parallel-plate reactor. Mixtures of SF$_6$ were used with varying amounts of O$_2$. RF power ranged from 50 to 300 W.

Wafers received a silicon-nitride deposition (PECVD-nitride), using conditions similar to those found to be effective for bulk and surface passivation in STRING-RIBBON™ mc-Si. (See: D. S. Ruby, W. L. Wilbanks, C. B. Fleddermann, and J. I. Hanoka (Id.) which is incorporated by reference herein in its entirety.) The plasma-nitride depositions were performed using the PECVD chamber of the PLASMATHERM™ reactor. Reaction gases for nitride deposition were a 5% mixture of silane in helium, nitrogen, and anhydrous ammonia. The optional H-passivation treatment consists of an exposure to a pure ammonia plasma between 300–400 C. in the PECVD reactor. It was discovered that less power was required to generate a NH$_3$-plasma than a H$_2$-plasma, resulting in less surface damage. Nitride-coated cells then received a forming gas anneal (FGA) at 300 C. for 30 minutes. The cells at this point were returned to the production line for final cell processing, if any.

Experimental Results (Emitter-Etchback Studies)

Si etch rates and uniformity for various RIE parameters using the PLASMATHERM™ reactor were investigated and compared with those obtained using an older but similar VACUTEC™ reactor, which produced SASE cells with half a percent higher efficiency than control cells. (See: D. S. Ruby, P. Yang, M. Roy and S. Narayanan, Proc. 26th IEEE PVSC, Anaheim, Calif., September 1997, pp. 39–42.) Uniformity was monitored by measuring emitter sheet resistance over the full 130-cm$^2$ area of commercial wafers after the etchback. Surface damage was monitored by measuring the emitter saturation current density ($J_{oe}$) on high-resistivity float-zone wafers after passivation with a PECVD-nitride film. (See: D. S. Ruby, W. L. Wilbanks, and C. B. Fleddermann. Proc. First WCPEC, December 1994, pp. 1335–1338.)

A set of parameters were found for rf-power, flow rate, and pressure for the PLASMATHERM™, which resulted in better uniformity and less surface damage than obtained with the VACUTEC™. The best result reduced uniformity variation from 10% to 2% and reduced $J_{oe}$ from 270 to 225 fA/cm$^2$ on 100 Ω/sq. emitters.

(Emitter-Passivation Studies)

Previous work with the VACUTEC™ had showed that lower $J_{oe}$ values and better surface passivation could be obtained using a 3-step nitride deposition process as compared to a single continuous deposition. (See: D. S. Ruby, P. Yang, M. Roy and S. Narayanan, Proc. 26th IEEE PVSC, Anaheim, Calif., September 1997, pp. 39–42.) In this example, the 3-step process started with deposition of a thin layer of nitride to protect the Si surface, followed by exposure to a NH$_3$-plasma, and finally the deposition of the remaining nitride required to attain the correct thickness for ARC purposes.

Figure 10:
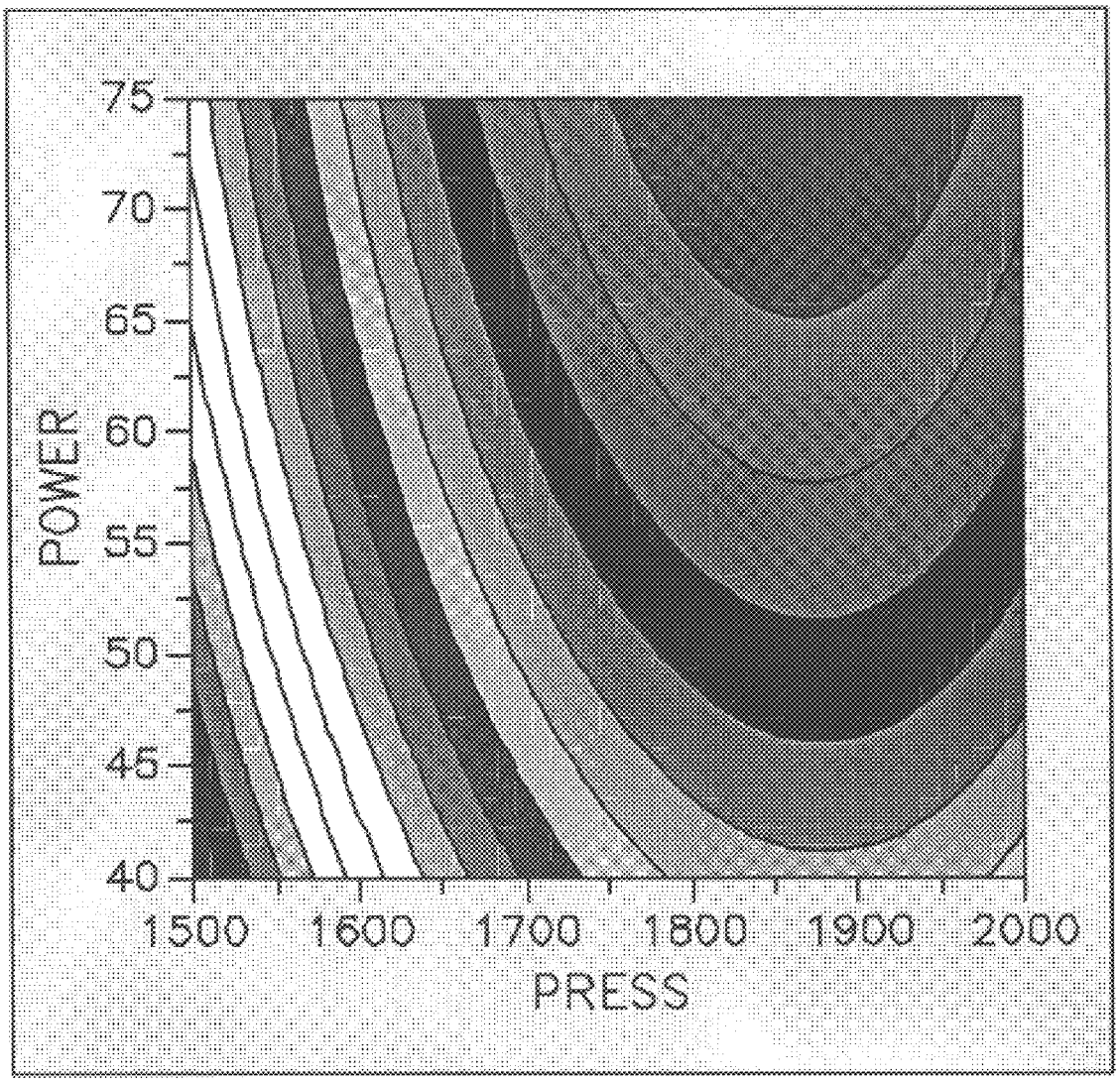
FIG. 10 shows a contour plot for cells made according to another example embodiment using the invention principles.

Comparison using the PLASMATHERM™ also showed better passivation using the 3-step process. A statistically designed multifactor experiment was conducted to find which 3-step parameters that would minimize $J_{oe}$ on float zone wafers using response surface methodology described in the two references just cited. The results of a quadratic interaction experiment are shown in FIG. 10. The Figure depicts a contour plot showing the response of $J_{oe}$ to the power (W) and pressure (mT) during NH$_3$-treatment with a protective-nitride thickness of 10 nm. $J_{oe}$ ranges from 216 in the lower left corner to a minimum of 161 fA/cm$^2$ near the upper right corner. The duration of the NH$_3$ hydrogenation was 20 minutes.

(SASE Cell Processing)

Parameters were used that produced minimum $J_{oe}$ on 130-cm$^2$ cells processed up through gridline firing on the SOLAREX™ production line. It was investigated whether shorter NH$_3$-treatments would retain the benefits of surface passivation. Results of IV testing are shown in Table 4.

TABLE 4

| Eff. (%) | $J_{SC}$ (mA/cm$^2$) | $V_{OC}$ (mV) | FF (%) |
|---|---|---|---|
| 90 sec. RIE, 1-step SiN, FGA | | | |
| 12.3 ± 0.4 | 30.5 ± 0.0 | 565 ± 4 | 71.6 ± 1.6 |
| 90 sec. RIE, 3-step SiN, 5 min NH$_3$, FGA | | | |
| 12.9 ± 0.1 | 30.6 ± 0.1 | 573 ± 1 | 73.5 ± 0.4 |
| 90 sec RIE, 3-step SiN, 10 min NH$_3$, FGA | | | |
| 12.4 ± 0.0 | 30.3 ± 0.0 | 570 ± 0 | 72.0 ± 0.0 |
| 150 sec RIE, 1-step SiN, FGA | | | |
| 12.1 ± 0.5 | 30.1 ± 0.0 | 562 ± 7 | 71.3 ± 2.2 |
| 150 sec RIE, 3-step SiN, 5 min NH$_3$, FGA | | | |
| 12.9 ± 0.2 | 30.4 ± 0.3 | 576 ± 4 | 73.5 ± 1.4 |
| 150 sec RIE, 3-step SiN, 10 min NH$_3$, FGA | | | |
| 13.0 ± 0.2 | 30.4 ± 0.0 | 577 ± 2 | 74.0 ± 0.9 |
| Control Cells: No emitter etchback, TiO$_2$ ARC | | | |
| 12.6 ± 0.0 | 30.2 ± 0.1 | 569 ± 0 | 73.5 ± 0.0 |

The data in the Table pertain to six SASE sequences that were applied to 12 SOLAREX™ mc-Si cells (2 cells/sequence) using matched material from the same ingot as the controls. Illuminated cell IV data±standard deviation are shown normalized to a constant transmittance to account for the additional 1.1% spectral-weighted absorbtance in the nitride. (See: P. Doshi, G. E. Jellison, Jr., and A. Rohatgi, "Characterization and optimization of absorbing plasma-enhanced chemical vapor deposited antireflection coatings for silicon photovoltaics," Appl. Opt., 36, Oct. 20, 1997.)

The first three groups of cells were not etched back sufficiently, because the etch duration did not account for etching through a thermal oxide that grew on the cells during gridline firing. These cells did not show consistent improvement over the controls.

The second three groups used a longer, 150-second RIE-etch that removed the thermal oxide and then etched the emitters from their starting sheet resistance of 50 Ω/sq. to 100 Ω/sq. The 1-step cells showed a drop in performance compared to the controls, in agreement with our $J_{oe}$ results that showed poorer passivation by a 1-step nitride. Once the emitter was etched back to 100 Ω/sq., it required excellent surface passivation to avoid excess surface recombination.

Figure 11:
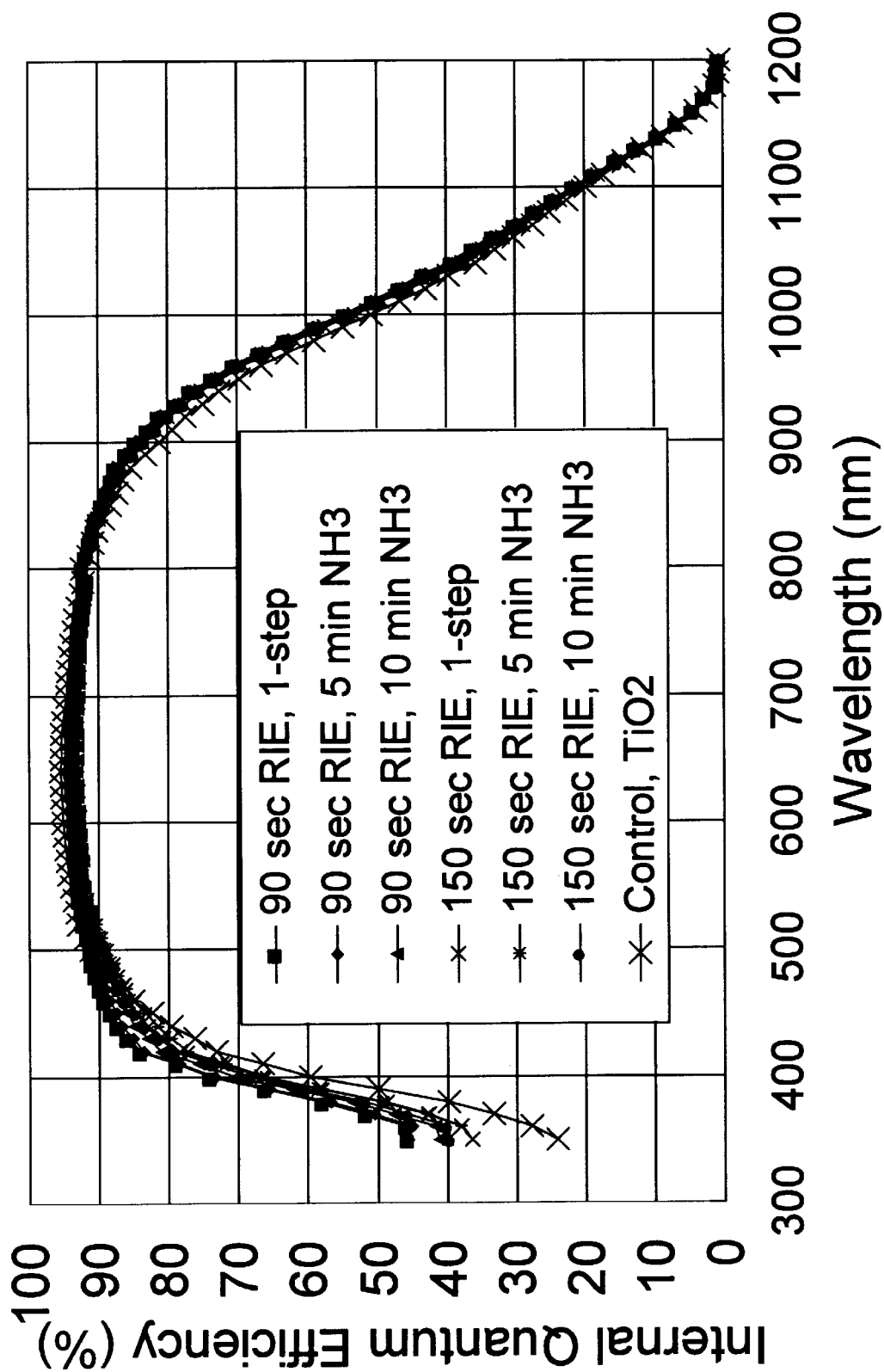
FIG. 11 shows IQE curves for cells made according to another example embodiment using the invention principles.

The 3-step cells showed significant improvements, especially in $V_{OC}$, suggesting longer diffusion lengths from bulk defect passivation. Internal quantum efficiency (IQE) of these cells, showing both improved red and blue response is shown in FIG. 11.

All the nitride-passivated cells showed similar red and blue response, consistent with their similar $J_{SC}$ values. The $J_{SC}$ was no greater than that of the control cell because the increase in IQE was compensated by parasitic absorbtion in the nitride. This was due to the high refractive index of 2.2 used to minimize reflectance. Another series of SASE cells were processed using a lower refractive index of 2.12 to reduce the spectrally weighted absorbtance to 0.5%. Normalized IV data for these cells are shown in Table 5. These data are for three SASE sequences that were applied to seven SOLAREX™ mc-Si cells using matched material from the same ingot as before. IV data are shown normalized to the transmittance of the control cells.

TABLE 5

| Eff. (%) | $J_{SC}$ (mA/cm$^2$) | $V_{OC}$ (mV) | FF (%) |
|---|---|---|---|
| 140 sec RIE, 3-step SiN, 5 min NH$_3$, FGA | | | |
| 12.9 ± 0.2 | 31.1 ± 0.1 | 572 ± 3 | 72.7 ± 0.3 |
| 140 sec RIE, 3-step SiN, 10 min NH$_3$, FGA | | | |
| 13.1 ± 0.0 | 31.4 ± 0.1 | 574 ± 0 | 73.0 ± 0.1 |
| 140 sec RIE, 3-step SiN, 20 min NH$_3$, FGA | | | |
| 12.2 ± 0.4 | 31.2 ± 0.1 | 563 ± 5 | 69.5 ± 1.5 |
| Control Cells: No emitter etchback, TiO$_2$ ARC | | | |
| 12.3 ± 0.1 | 30.8 ± 0.0 | 558 ± 2 | 71.4 ± 0.4 |

The SASE cells had consistently higher $J_{SC}$ than the controls, because the increased IQE due to passivation was not lost due to excessive parasitic absorption. The cells that received 10 minutes of NH$_3$-hydrogenation performed the best, exceeding the controls by almost a full percentage point due to the large improvement in $V_{OC}$. However, improvement in $V_{OC}$ was reduced for the cells that received a 20-minute NH$_3$-exposure. These cells also suffered a loss in fill factor due to an increase in diode ideality factor.

(RIE-textured Cells)

Figure 12:
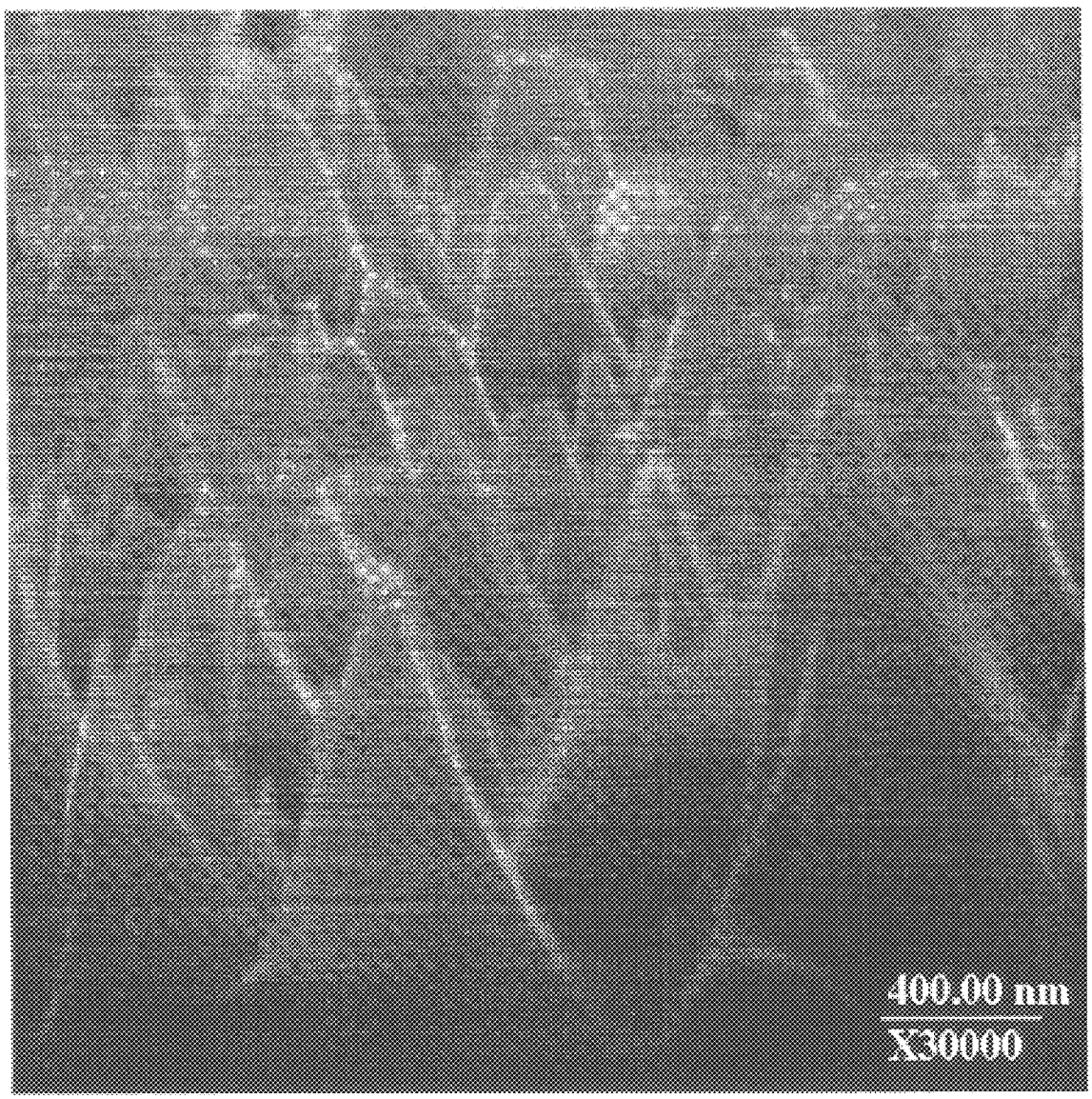

An RIE process was developed that used SF$_6$/O$_2$ mixtures to produce a randomly textured surface on c-Si. Specifically, sputtered Al from the RIE anode was used as the etch mask where the power was 50 watts, the SF$_6$ partial pressure was 100 mTorr, and O$_2$ partial pressure was 80 mTorr. FIG. 12 shows an SEM of an RIE-textured sample with less than 0.5% spectral reflectance at all wavelengths. The surface shown in the Figure was textured for 30 minutes. About 6.0 μm of Si was removed from the surface shown in FIG. 12. This process could be applied to the wafers before emitter diffusion, when removal of a few micrometers of Si would not be an issue. The SASE process could then be applied after gridline firing as usual.

Figure 13:
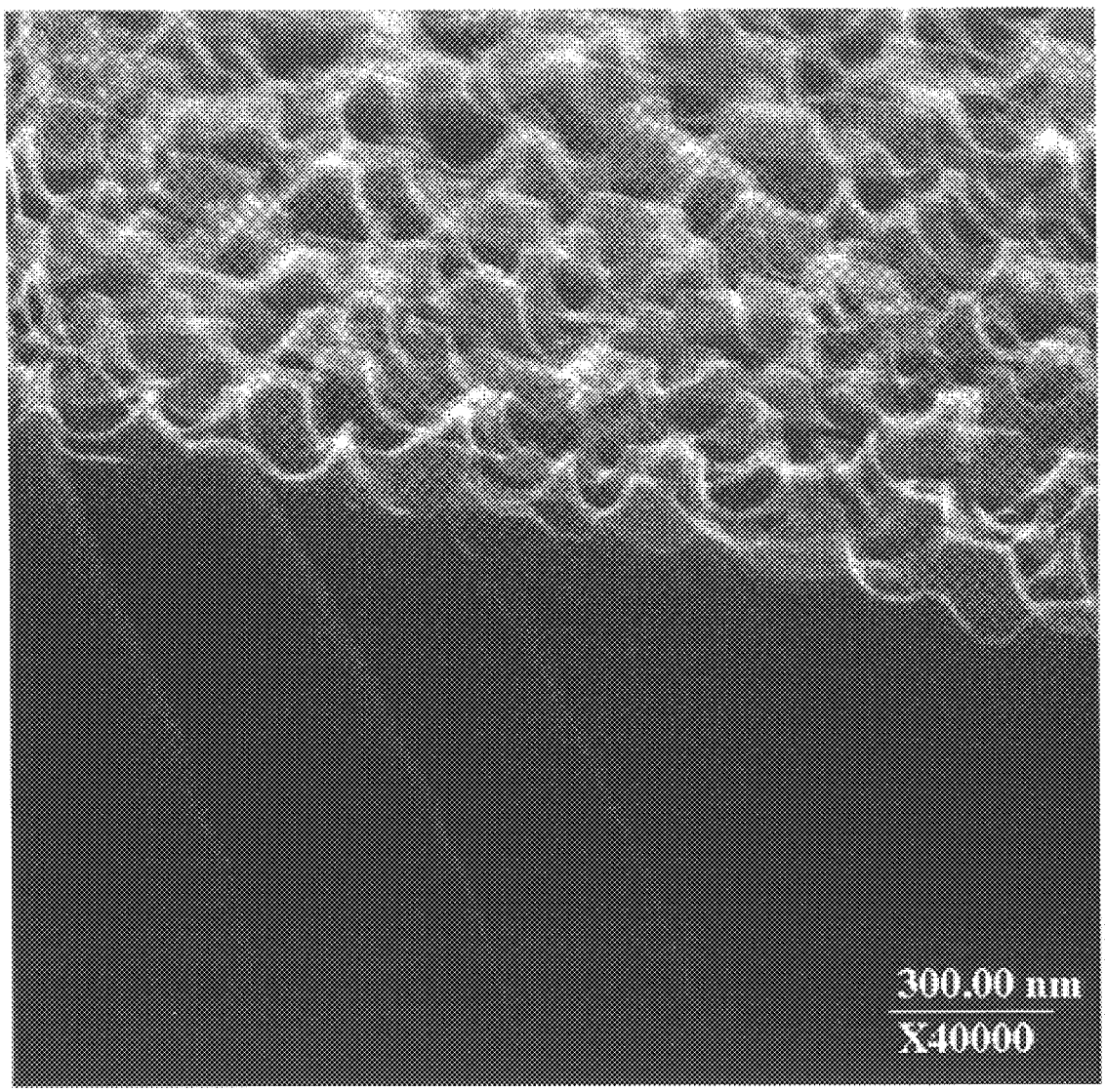

A second process was developed that could be applied after emitter diffusion since it removed only 0.1 μm from the surface, increasing the emitter sheet resistance to about 60 Ω/sq. Specifically in this process, CVD-oxide was used as the etch mask. The power was 300 watts, partial pressure of $SF_6$ was 120 mTorr, partial pressure of $O_2$ was 40 mTorr, and the duration of the etch was 8 to 16 minutes. This process required the Si surface to be prepared by having silicon-dioxide deposited on it. This can be accomplished using low-cost, low-temperature techniques such as atmospheric-pressure CVD. An SEM of such a textured surface (with 0.1 μm feature sizes) prepared in this manner near a cleaved wafer edge is shown in FIG. 13.

Figure 14:
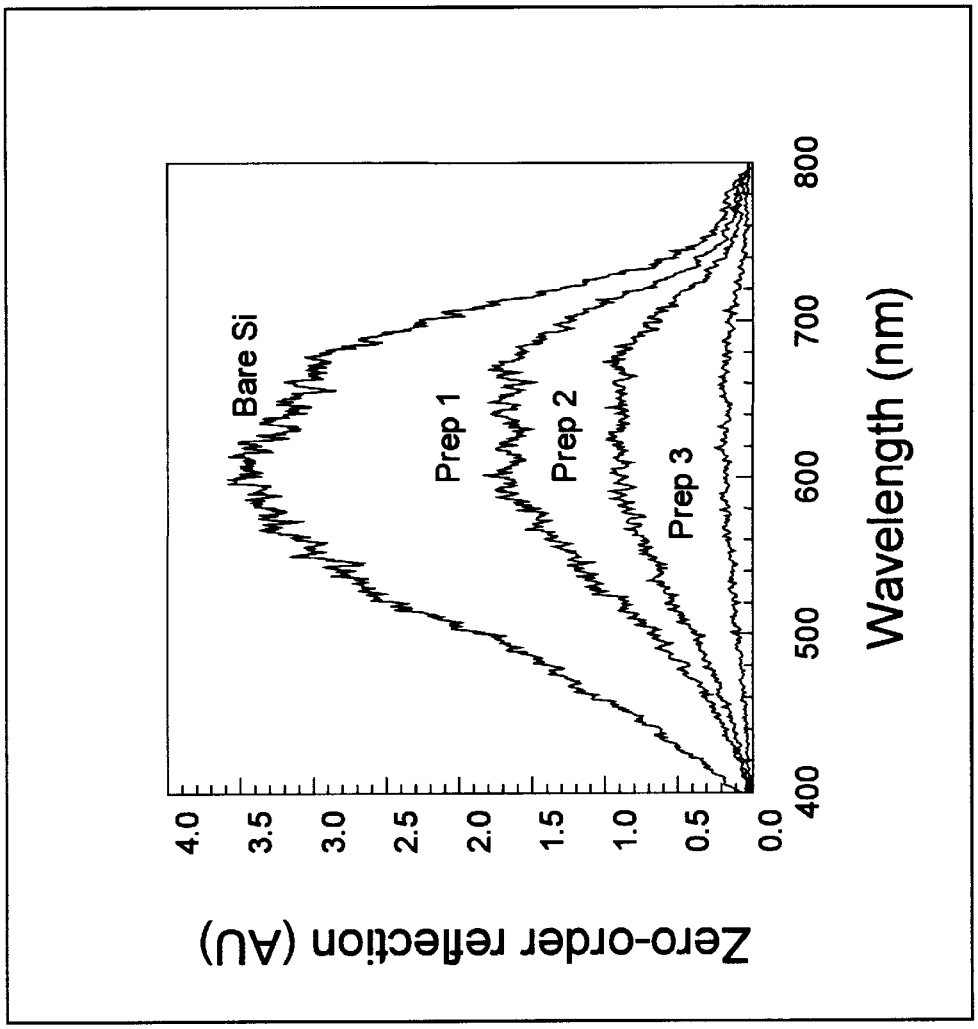
FIG. 14 shows example specular reflectance curves comparing textured cell surfaces made using the invention to untextured cell surfaces.

This second process was applied to single-crystal wafers with three different surface preparation conditions, specifically, different deposited oxide thicknesses. Specular reflectance curves of the three resulting textures are compared to that of bare Si in FIG. 14. The reflectance of the textured samples was reduced by factors of 2.2, 4.4, and 24, respectively.

This second process was applied to full-size mc-Si wafers with gridlines using two preparation conditions. These cells are currently in process at SOLAREX™ and could provide an increase of up to a full percentage point in efficiency due to reflectance reduction alone.

Conclusions Drawn from this Example

The SASE process was improved using statistical experiments, more complete emitter etchback, and lower absorbtance nitride films to achieve nearly a full percentage point efficiency increase over the standard production line process. The use of an optimum-duration, ammonia-plasma hydrogenation treatment was crucial to the increased performance. In addition, plasma texturing was shown to reduce reflectance significantly while removing only the heavily diffused portion of the emitter region.

From the foregoing description, one skilled in the art can easily ascertain the essential characteristics of the invention defined in this specification and the appended claims, and without departing from the spirit and scope thereof can make various changes and modifications of the invention to adapt it to various usages and conditions. Such changes and modifications as would be obvious to one skilled in the art are intended to be included within the scope of the following claims. The entire disclosures of all references, applications, patents and publications cited above are hereby incorporated by reference.

We claim:

1. A process for manufacturing silicon solar cells comprising:
   providing silicon having an emitter region which, according to one boundary dimension of said emitter region, defines a surface of said silicon, and which emitter region is diffused with a dopant;
   positioning at least one electrical contact on said surface of said silicon so that said at least one electrical contact is adjacent to part of said emitter region;
   etching at least a portion of said surface of said silicon using plasma whereby said at least one electrical contact masks said part of said emitter region adjacent to which it is positioned, and dopant concentrations in portions of said surface which are not adjacent to said at least one electrical contact are caused to be reduced as compared with dopant concentrations in said part of said emitter region adjacent to which said at least one electrical contact is positioned.

2. The process of claim 1 wherein said dopant comprises phosphorus.

3. The process of claim 2 wherein said at least one electrical contact comprises at least one grid comprising silver and which is formed by screen printing.

4. The process of claim 3 further comprising the step of plasma hydrogenation.

5. The process of claim 4 further comprising the step of PECVD nitride deposition.

6. The process of claim 5 wherein said step of PECVD nitride deposition comprises
   a first nitride deposition followed by plasma hydrogenation and a second nitride deposition resulting in a nitride layer of sufficient thickness to function as an anti-reflection coating.

7. The process of claim 3 further comprising the step of PECVD nitride deposition.

8. The process of claim 7 wherein said step of PECVD nitride deposition comprises
   a first nitride deposition followed by plasma hydrogenation and a second nitride deposition resulting in a nitride layer of sufficient thickness to function as an anti-reflection coating.

9. The process of claim 1 further comprising the step of depositing on said surface a pervious polycrystalline coating prior to said step of etching at least a portion said surface of said silicon using plasma.

10. The process of claim 9 wherein said dopant comprises phosphorus.

11. The process of claim 10 wherein said at least one electrical contact comprises at least one grid comprising silver and which is formed by screen printing.

12. The process of claim 11 further comprising the step of PECVD nitride deposition.

13. The process of claim 12 wherein said step of PECVD nitride deposition comprises
   a first nitride deposition followed by plasma hydrogenation and a second nitride deposition resulting in a nitride layer of sufficient thickness to function as an anti-reflection coating.

14. The process of claim 10 further comprising the step of plasma hydrogenation.

15. The process of claim 14 further comprising the step of PECVD nitride deposition.

16. The process of claim 15 wherein said step of PECVD nitride deposition comprises
   a first nitride deposition followed by plasma hydrogenation and a second nitride deposition resulting in a nitride layer of sufficient thickness to function as an anti-reflection coating.

17. A photovoltaic cell manufactured by a process selected from the group consisting of the processes of claims 1, 2, 3, 4, 7, 5, 8, 6, 9, 10, 11, 14, 12, 15, 13, 16, 20, 21, 24, 22, 25, 23, 26, 27, and 29.

18. The photovoltaic cell of claim 17 wherein said silicon is multicrystalline silicon, said plasma hydrogenation, comprises using $NH_3$, said step of etching uses plasma comprising $SF_6$, said pervious polycrystalline coating is selected from the group consisting of $SiO_2$ and metal.

19. The photovoltaic cell of claim 18 wherein said step of etching uses plasma comprising $SF_6$ and $O_2$.

20. A process for manufacturing photovoltaic cells comprising the steps of:
   screen-printing electrical gridlines on the surface of multicrystalline silicon solar cell substrate material having a surface, said surface describing a boundary of an emitter region of said multicrystalline silicon solar cell substrate material wherein said emitter region is doped to contain phosphorus;

performing plasma etching of said emitter region, using an etchant comprising $SF_6$, wherein said electrical gridlines mask a first part of said emitter region, and a second part of said emitter region remains unmasked by said electrical gridlines, and wherein phosphorus is removed from said first part of said emitter region to a greater degree than from said second part of said emitter region;

depositing an antireflective coating on said surface of said multicrystalline silicon solar cell substrate material using PECVD nitride deposition.

21. The process of claim 20 wherein said step of depositing an antireflective coating comprises depositing a first layer of nitride on said surface, performing a hydrogenation of said multicrystalline silicon using plasma comprising $NH_3$, and depositing a second layer of nitride on said surface.

22. The process of claim 21 further comprising the step of depositing $SiO_2$ on said surface prior to said step of performing plasma etching.

23. The process of claim 22 wherein said etchant further comprises $O_2$.

24. The process of claim 20 further comprising the step of depositing $SiO_2$ on said surface prior to said step of performing plasma etching.

25. The process of claim 24 wherein said etchant further comprises $O_2$.

26. A process for manufacturing photovoltaic cells comprising the steps of:

depositing $SiO_2$ on the surface of multicrystalline silicon solar cell substrate material having a surface, performing a first plasma etching of said surface, using an etchant comprising $SF_6$, whereby said surface attains texture characteristics comprising a plurality of randomly distributed substantially pyramidal features, doping said substrate material using phosphorus, and depositing electrical gridlines on said surface.

27. The process of claim 26 further comprising the step of performing a second plasma etching of said surface, using an etchant comprising $SF_6$, after said step of depositing electrical gridlines on said surface is performed.

28. The process of claim 27 further comprising the step of depositing an antireflective coating on said surface using PECVD nitride deposition.

29. The process of claim 26 further comprising the step of depositing an antireflective coating on said surface using PECVD nitride deposition.

* * * * *